(12) United States Patent
Neuberth et al.

(10) Patent No.: US 8,222,985 B2
(45) Date of Patent: *Jul. 17, 2012

(54) COMPACT SUPERCONDUCTING MAGNET CONFIGURATION WITH ACTIVE SHIELDING HAVING A SHIELDING COIL CONTRIBUTING TO FIELD FORMATION

(75) Inventors: Gerald Neuberth, Bruchsal (DE); Michael Westphal, Offenbach (DE)

(73) Assignee: Bruker BioSpin GmbH, Rheinstetten (DE)

( * ) Notice: Subject to any disclaimer, the term of this patent is extended or adjusted under 35 U.S.C. 154(b) by 10 days.

This patent is subject to a terminal disclaimer.

(21) Appl. No.: 12/923,956

(22) Filed: Oct. 18, 2010

(65) Prior Publication Data

US 2011/0084206 A1 Apr. 14, 2011

Related U.S. Application Data

(63) Continuation-in-part of application No. 12/385,684, filed on Apr. 16, 2009, now Pat. No. 7,898,258.

(51) Int. Cl.
*G01R 33/421* (2006.01)
*G01V 3/00* (2006.01)
(52) U.S. Cl. ........ 335/301; 335/216; 335/299; 324/319; 324/320
(58) Field of Classification Search .................. 335/216, 335/301, 299; 324/318–320
See application file for complete search history.

(56) References Cited

U.S. PATENT DOCUMENTS 5,581,223 A * 12/1996 Ono et al. ..................... 335/301
* cited by examiner Primary Examiner — Ramon Barrera
(74) Attorney, Agent, or Firm — Paul Vincent

(57) ABSTRACT

A superconducting magnet configuration (4; 14) for generating a homogeneous magnetic field $B_0$ in an examination volume (4b), has an interior radial superconducting main field coil (1) which is disposed rotationally symmetrically about an axis (z-axis) and an oppositely driven coaxial radially exterior superconducting shielding coil (2) is characterized in that the magnet configuration (4; 14) consists of the main field coil (1), the shielding coil (2), a ferromagnetic field formation device (3; 18) and a ferromagnetic shielding body (AK), wherein the ferromagnetic field formation device (3; 18) is located at the radially inside of the main field coil (1) and the ferromagnetic shielding device (AK) surrounds the main field coil (1) and the shielding coil (2) in a radial and axial direction, the main field coil (1) consisting of an unstructured solenoid coil or of several radially nested unstructured solenoid coils (15, 16) which are driven in the same direction, the axial extent $L_{abs}$ of the shielding coil (2) being smaller than the axial extent $L_{haupt}$ of the main field coil (1), wherein the axial magnetic field profile (5) generated by the main field coil (1) and the shielding coil (2) during operation has a minimum of the field strength along the axis (z-axis) in the center (4a) and a maximum of the field strength on each side of the center (4a), and wherein the axial magnetic field profile (6) generated by the ferromagnetic field formation device (3; 18) and the ferromagnetic shielding body (AK) during operation has a maximum of the field strength along the axis (z-axis) in the center (4a) and a minimum of the field strength on each side of the center (4a). The magnet configuration in accordance with the invention has a very simple structure.

19 Claims, 8 Drawing Sheets

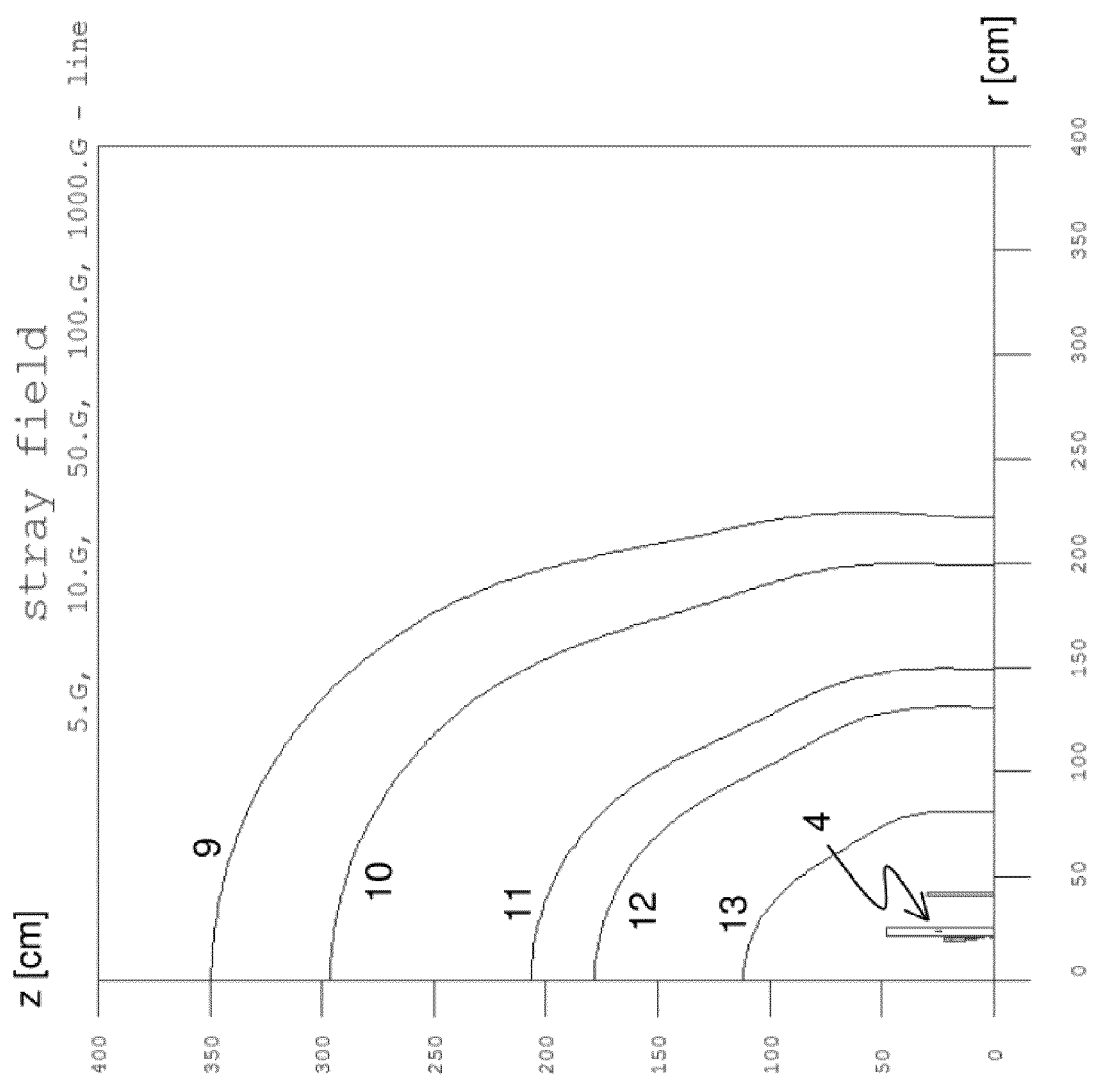

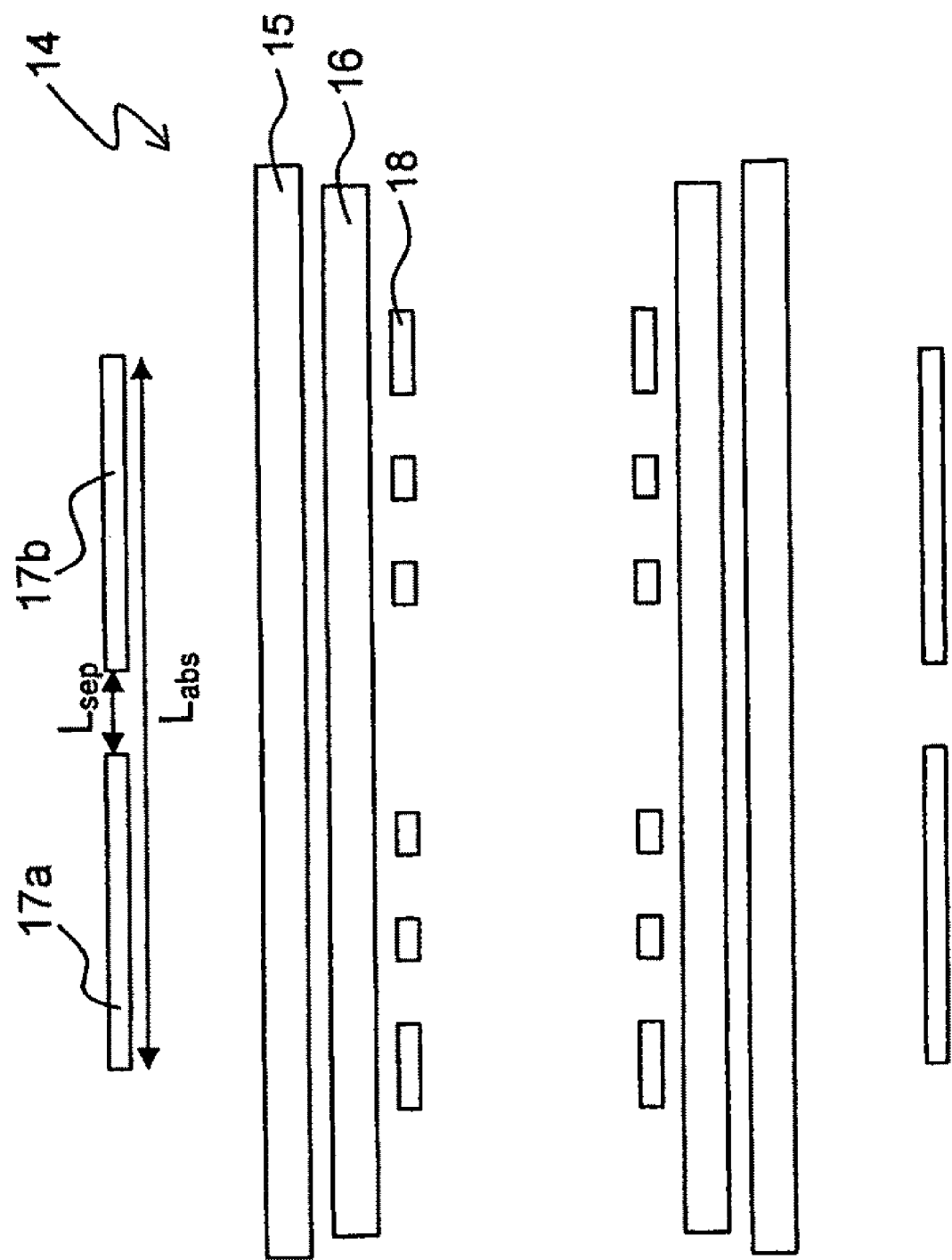

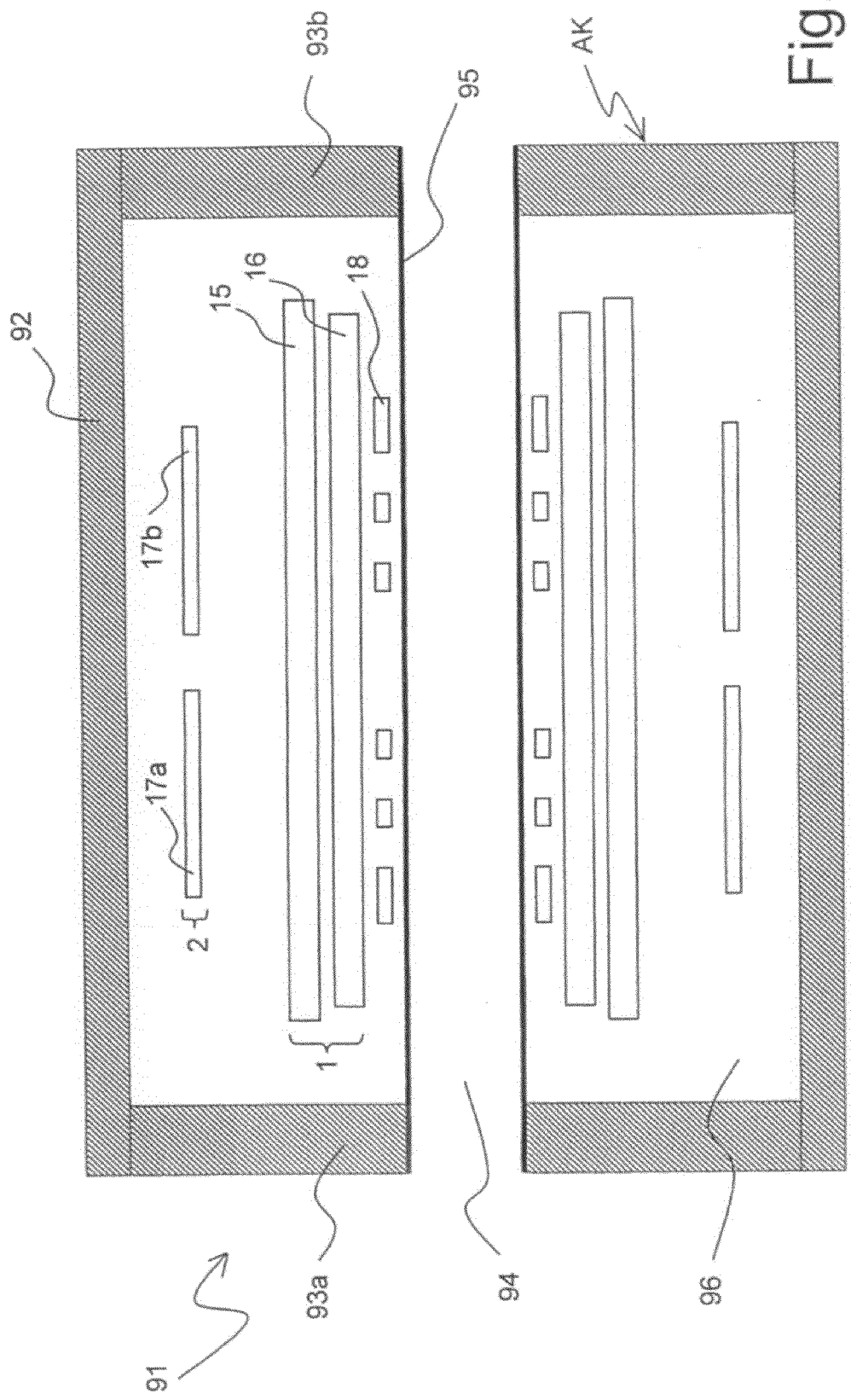

COMPACT SUPERCONDUCTING MAGNET CONFIGURATION WITH ACTIVE SHIELDING HAVING A SHIELDING COIL CONTRIBUTING TO FIELD FORMATION

This application is a continuation in part of U.S. Ser. No. 12/385,684 filed Apr. 16, 2009 now U.S. Pat. No. 7,898,258 and also claims Paris Convention priority of DE 10 2009 045 774.7 filed Oct. 16, 2009 the complete disclosures of which are hereby incorporated by reference.

BACKGROUND OF THE INVENTION

The invention concerns a supplementary patent application having a further improvement of an invention subsequently published in German patent application 10 2008 020 107.3-54 (basis invention).

In particular, the invention concerns a superconducting magnet configuration with active shielding for generating a homogeneous magnetic field $B_0$ in an examination volume,
  having an radially inner superconducting main field coil which is disposed rotationally symmetrically about an axis (z-axis)
  and a coaxial radially exterior superconducting shielding coil which is operated in an opposite manner.

Such a magnet configuration is known, for example, from EP 1 564 562 A1.

Nuclear Magnetic Resonance (NMR) is a method for examining the characteristics of a sample. NMR spectroscopy is used for analyzing the chemical composition (or rather the chemical bonds) of a sample. NMR tomography is used, as a rule, for determining the proton density (or rather the water content) as a function of position in a larger sample (such as a part of the human body) to gain information about the sample's inner structure. Both methods are based on the principle of RF(=radio frequency) pulses being applied to a sample aligned in a static magnetic field and measuring the sample's RF response. The sample's characteristics can be concluded from this response. In general, particularly strong, homogeneous static magnetic fields are preferred in NMR as they yield the best qualitative measurement results.

High magnetic field strength can be generated using superconducting magnet coils, which are, as a rule, cooled to a typical working temperature of 4.2 K by means of liquid helium in a cryostat. Solenoid magnet coils enclosing a circular-cylindrical examination volume are particularly frequently used for this purpose.

One known method for homogenizing ("shimming") the static magnetic field in the examination volume consists in placing ferromagnetic material close to the examination volume, in particular within the main magnetic field coil ("passive shim". See, for example, DE 101 16 505 A1). Another known method consists in use of additional magnetic field coils (shim coils) whose magnetic field is superimposed on the magnetic field of a main field coil ("active shim"). Superconducting shim coil systems in the cryostat are known from DE 199 40 694 C1. Both active and passive shim systems are based on the main field coil and the shim system jointly generating a homogeneous magnetic field in the examination volume.

If no special precautions are taken, a strong magnetic field in the examination volume is accompanied by a sizable magnetic field in the surroundings. This external magnetic field is also referred to as the "stray field" and is generally undesired as it may interfere with technical devices in the environment. For example, stray fields can delete magnetic memories from hard disks or credit cards or cause failure of pacemakers. A particular method for reducing stray fields consists in disposing a shielding coil radially outside of the main field coil which generates a magnetic dipole moment of the same absolute value as the main field coil but oppositely directed.

According to the state of the art as discussed in EP 1 564 562 A1 (FIG. 1, for example), the main field coil can consist of several axially adjacent windings of superconductor wire, which thereby form a structured coil. A structured main field solenoid coil has the advantage that the type of structuring allows relatively easy shaping of the magnetic field in the examination volume, so that, altogether, i.e. together with the magnetic field generated by the shielding coil, a homogeneous magnetic field in the examination volume is generated. The influence of the shielding coil on the homogeneity of the magnetic field in the examination volume is usually relatively small due to the larger radial distance to the examination volume compared to the main field coil. The windings of this structured solenoid coil are generally held by a mechanical holding device and are usually located within the winding chambers of a coil form. The magnetic field generated by the windings causes strong forces of attraction between them, wherein the windings are pressed against the holding device (usually the lateral peripheries of the winding chambers) in an axial direction. In particular for magnet configurations generating particularly strong magnetic fields of 6 T or more, the associated surface pressure can reach very high values.

An essential disadvantage of such magnet configurations with structured main field coils consists in this very high surface pressure which causes mechanical relaxation processes in the adjacent windings of superconductor wire, which can then pass into their normal conducting state as a result of their vanishing heat capacity at their low working temperature to thereby cause a so-called quench. Such an event is undesirable and expensive, since, during a quench, the temperature of the magnet coil rises from the working temperature to values in the 40 to 80 K region, the expensive liquid helium used for cooling evaporates and is lost, and re-starting the magnet configuration can cause delays of several days.

A magnet configuration having a main field coil with structured and unstructured solenoid coils is known from DE 101 04 054 C1. According to that invention, simple magnet configurations become feasible if a field formation device of magnetic material is placed radially inside of the main field coil. Nevertheless, at least some of the main field coils in accordance with DE 101 04 054 C1 comprise structured solenoid coils to generate a sufficiently homogeneous magnetic field. According to DE 101 04 054 C1, simple main field coils having field formation devices of magnetic material are only feasible if at least part of the field formation device has a low radial distance of less than 80 mm from the magnetic axis and thereby a sufficiently strong influence. Magnet configurations with a larger usable diameter of 30 cm and more, for instance, are not possible with this limitation.

EP 1 564 562 A1 discloses magnet configurations with active shielding which require no sections of structured solenoid coils whatsoever in the main field coil. As in DE 101 04 054 C1, these configurations comprise field formation devices of magnetic material located radially inside of the main field coil, but there is no limiting requirement of low radial distance between the field formation device and the magnet axis. Constructing the main field coil without any structured solenoid coils is enabled by using a magnet body with appropriate dimensions made of magnetic material and located radially exterior to the main field coil. However, in magnet configurations with a usable diameter of 60 cm and more, for instance, the magnet body, and thus the entire magnet configuration, becomes very heavy, thereby rendering transport expensive and limiting the options for setting up the magnet configuration due to great floor loading.

Magnet configurations comprising a main field coil, a shielding coil, a field formation device made of magnetic material and located radially inside of the main field coil, and a yoke shielding made of magnetic material and located radially exterior to the shielding coil, are known from EP 0 332 176 A2, wherein the axial extent of the shielding coil is greater than the axial length of the main field coil and the yoke shielding. This prior art suggests construction of the main field coil as a structured solenoid coil. In accordance with the teaching of EP 0 332 176 A2, a magnet configuration with a sufficiently homogeneous magnetic field B0 in the examination volume having an unstructured solenoid coil as the main field coil would not be feasible: a structured solenoid coil must be used as the main field coil.

Therefore, the invention is based on the task of providing a superconducting magnet configuration with active shielding having a homogeneous, particularly strong B0 magnetic field in the examination volume, with a very simple structure, in particular wherein the main field coil can be exclusively made from unstructured solenoid coils and the magnet configuration as such can be much more compact.

SUMMARY OF THE INVENTION

This task is solved by a magnet configuration of the above-mentioned kind, which is characterized in that
the magnet configuration consists of the main field coil, the shielding coil, a ferromagnetic field formation device and a ferromagnetic shielding body, wherein the ferromagnetic field formation device is located radially inside of the main field coil,
and the ferromagnetic shielding body surrounds the main field coil and the shielding coil in a radial and axial direction,
the main field coil consists of an unstructured solenoid coil or of several radially nested unstructured solenoid coils which are driven in the same direction,
the axial extent $L_{abs}$ of the shielding coil is smaller than the axial extent $L_{haupt}$ of the main field coil,
wherein the axial magnetic field profile along the axis (z-axis) generated by the main field coil and the shielding coil during operation has a minimum field strength in the center and a maximum field strength on each side of the center,
and wherein the axial magnetic field profile along the axis (z-axis) generated by the ferromagnetic field formation device and the ferromagnetic shielding body during operation has a maximum field strength in the center and a minimum field strength on each side of the center.

The magnet configuration in accordance with the invention has a highly simplified, compact structure. In particular, the characterizing axial magnetic field profile can only be generated if the radial distance between the shielding coil and the main field coil is relatively small, wherein the shielding coil contributes substantially to the static magnetic field $B_0$ (aligned parallelly to the z-axis) in the examination volume.

At the present state of the art, the magnetic field $B_0$ in the examination volume is homogenized by a magnetic field with a first intensity profile in the axial direction generated by the main field coil and a magnetic field with a second, complementary intensity profile in the axial direction generated by the (active or passive) shim system. Overlapping of the two profiles causes a magnetic field strength in the examination volume which is constant over great axial length. In prior art, the shielding coil is sufficiently distant from the examination volume to ensure that the magnetic field it generates has substantially no impact on the homogeneity of the magnetic field in the examination volume.

In contrast, the invention integrates the shielding coil into the homogenization of the static magnetic field in the examination volume. In the magnet configurations in accordance with the invention, the main field coil and the shielding coil jointly generate a magnetic field with an intensity profile that is widely M-shaped in the axial direction (z-direction). The length of the shielding coil and the radial distance between the shielding coil and the main field coil are thereby set sufficiently small. It should be noted that the main field coil alone would only generate an intensity profile which is wide and essentially exhibits one broad bump. The ferromagnetic field formation device acts, together with the ferromagnetic shielding body, as a passive shim system to generate a common magnetic field contribution having a W-shaped intensity profile, which is complementary to the M-shaped intensity profile. Overlapping of the wide, W-shaped intensity profile of the ferromagnetic field formation device and the ferromagnetic shielding body with the wide, M-shaped intensity profile of the main field coil and the shielding coil generates an overall magnetic field strength in the examination volume which is constant over great axial length. A magnet configuration in the examination volume in accordance with the invention typically achieves field homogeneities of $10^{-5}$ or better, preferably $10^{-6}$ or better.

In the design in accordance with the invention, the shielding coil can and must be radially closer to the examination volume to be able to have a sizable impact on the intensity profile of the magnetic field. This renders the magnet configuration radially more compact.

Furthermore, in the design in accordance with the invention, the axial extent $L_{abs}$ of the shielding coil can and must be smaller than the axial extent $L_{haupt}$ of the main field coil, since the M-shaped intensity profile could not otherwise be generated on the axis. The shielding coil is wound in the opposite direction (or has current conduction in the opposite direction) compared to the main field coil. The wide, M-shaped intensity profile of the main field coil and the shielding coil as a whole is a result of a reduction of the wide, single-bump intensity profile of the main field coil in the axial central area caused by the overlapping intensity profile of the shielding coil. The shielding coil, which is axially shorter than the main field coil, creates room for the service structures of the cryostat. These can be axially more inward in the radially exterior area than in prior art.

The compact structure of the magnet configuration in accordance with the invention saves not only room, in particular with regard to the height of the magnet configuration including the cryostat, but also material and weight. The magnet configuration in accordance with the invention consists (as far as the generation of the static magnetic field $B_0$ is concerned) merely of the main field coil, the shielding coil, the ferromagnetic field formation device and the ferromagnetic shielding body. In particular, no additional field formation coils are envisioned, which are connected in series with the main field coil.

The design of the magnet configuration in accordance with the invention is generally conceived in such a fashion that, through the magnet configuration alone and without considering production tolerances, a homogenous $B_0$ field is generated in the investigational volume (in particular, suitable for NMR applications and preferentially also suitable for high-resolution applications, hereby designated as the "theoretical homogenous design"). Inhomogeneities caused by production tolerances typically lie in the fluctuation band width of 200 ppm relative to the $B_0$ field in the center. The homogeneities caused by production tolerances can be easily compensated for using standard shimming procedures (for example an adjustable or flexible ferromagnetic field forming device or shim coils having a current circuit which is separate from the main field coil and which is usually driven or operated with a significantly smaller current density than that of the main field coil).

In addition, the simple structure, which is essentially based on unstructured solenoid coils which are easy to make with precision, also leads to an improved process tolerance when manufacturing the magnet configuration in accordance with the invention. As coil structurization is not required and only few coils are needed in total, quench safety is also improved. In the magnet configuration in accordance with the invention, the number of axial coil edges, which are exposed to an increased quench risk due to excessive forces is minimized.

In contrast to the invention subsequently published in German patent application 10 2008 020 107.3-54 (referred to herein as the "basis invention"), the magnet configuration consists essentially of the main field coil, the shielding coil, the ferromagnetic field forming device and the ferromagnetic shielding body. Accordingly, the magnet configuration is somewhat more complex in structure than that of German patent application 10 2008 020 107.3-54, since the magnet configuration of the current invention also has an additional ferromagnetic shielding body.

The shielding body reduces the stray field of the magnet configuration and also influences, to a limited extent, the magnetic field dependence in the investigational volume. The magnetic field shape $B_{F+AK}(z)$ produced together by the field forming device and the shielding body in accordance with the instant invention replaces the magnetic field shape $B_F(z)$ in the basis invention which is produced by the field forming device alone. In particular in accordance with the invention, the axial magnetic field profile $B_{F+AK}(z)$ along the axis (z-axis) produced by the ferromagnetic field forming device and the shielding body during operation has a maximum in field strength in the center at z=0 and minima in field strength at each side of the center.

Typically, the contribution $B_{AK}(z)$ of the shielding body to the overall field shape $B_{F+AK}(z)$ in the instant invention is less than 10% at any location in the investigational volume. However, the typical contribution $B_{AK}(z)$ of the shielding body to the common field profile $B_{F+AK}(z)$ exceeds 1% at least in some locations within the investigational volume.

The shielding body is typically made from a soft magnetic material such as steel. The shielding body preferentially also surrounds the field forming device both in the axial as well as in the radial direction.

In a particularly preferred embodiment of the magnet configuration in accordance with the invention, the shielding coil also consists of an unstructured solenoid coil. This renders the structure of the magnet configuration in accordance with the invention particularly simple. The main field coil also preferentially consists essentially of one single unstructured solenoid coil. The entire magnet configuration exhibits the three functions of generation of strong magnetic fields,
large examination volume with high field homogeneity, and
good localization of the stray field, while merely consisting of one unstructured solenoid coil as the main field coil and one unstructured solenoid coil as the shielding coil, along with the ferromagnetic field formation device and the ferromagnetic shielding body. A magnet configuration with only two unstructured solenoid coils as the only superconducting components could not be conceived any simpler.

Alternatively, it is also possible for the shielding coil to be made from a plurality of radially nested, unstructured solenoid coils which are driven in the same direction. This also leads to a relatively simple construction. Moreover, it is alternatively also possible in accordance with the invention to deviate from this particularly simple embodiment and envision structured solenoid coils as shielding coils. It can be envisioned, for example, that the shielding coil of a magnet configuration in accordance with the invention consists of two unstructured solenoid coils located mirror-symmetrically with respect to the center of the examination volume, wherein $L_{sep}<0.15*L_{abs}$ obtains for the axial separation $L_{sep}$ between these solenoid coils. It should be noted that the two unstructured solenoid coils can also be understood as two separate windings of one structured solenoid coil. In this embodiment, the shielding coil is two-part. In particular, shielding coils which are very short axially can help avoid an excessively sharp drop in the static magnetic field at the center of the examination volume.

In another preferred embodiment, $L_{max}>0.5*R_{if}$ obtains for the axial distance $L_{max}$ of the maxima of the field strength of the magnetic profile generated by the main field coil and the shielding coil and for the inner radius $R_{if}$ of the field formation device. This dimensioning enables a particularly wide, homogeneous static magnetic field.

In a preferred embodiment of the magnet configuration in accordance with the invention, the field strength $B_{max}$ of the maxima of the magnetic field profile generated by the main field coil and the shielding coil is between 10 ppm and 10,000 ppm, preferably between 100 ppm and 5000 ppm, stronger than the field strength $B_{min}$ of the central minimum of this magnetic field profile. These relative values of the maxima result in a particularly strong homogenizing effect of the overlapping of the magnetic field profiles of the main and shielding coils and of the ferromagnetic field formation device.

In another preferred embodiment, the main field coil and the shielding coil are connected in series. The same current therefore flows through the main field coil and the shielding coil. This facilitates alignment and charging of the magnet configuration.

A preferred further embodiment provides a superconducting switch for shortcircuiting the circuit formed by the main field coil and the shielding coil. This enables the magnet configuration to be operated in "persistent mode" (continuous operation without a power supply).

In one particularly advantageous embodiment, $L_{abs} \leq 0.85 L_{haupt}$, and preferably $L_{abs} \leq 0.65 L_{haupt}$. These length ratios have proven particularly suitable in practice with regard to the expansion of the M-shaped magnetic field profile. In addition, the magnet configuration is rendered particularly compact axially.

In a favorable embodiment, the magnet configuration is designed to generate the homogeneous magnetic field in the examination volume having a field strength of $B_{ges} \geq 6$ Tesla. This field strength—and the correspondingly large magnet coils required—bring to bear particularly well the advantages of the compact structure of the invention.

In another equally advantageous embodiment, $R_{if} \geq 80$ mm, and preferably $R_{if} \geq 300$ mm. These dimensions of the inner radius of the field formation device, again, bring to bear particularly well the advantages of the compact structure of the invention. It should be noted that the examination volume has a typical axial length of at least 30% of $R_{if}$ and a typical radial length of at least 30% of $R_{if}$.

In another preferred embodiment, $R_{iabs} \leq 2.2 * R_{ihaupt}$, and preferably $R_{iabs} \leq 2.0 * R_{ihaupt}$, obtain for the inner radius $R_{ihaupt}$ of the main field coil and the inner radius $R_{iabs}$ of the shielding coil. These radii ratios have proven successful in practice for adjusting the M-shaped magnetic field profile. In particular, the impact of the shielding coil on the magnetic field profile in the area of the z-axis will usually be sufficiently strong in this embodiment.

Another embodiment envisions the field formation device being placed inside a cryostat together with the main field coil and the shielding coil. In this embodiment, the ferromagnetic material of the field formation device is also cooled.

In an alternative embodiment, the field formation device is placed within a room temperature bore of a cryostat where the main field coil and the shielding coil are located. In this embodiment, the field formation device, which is at room temperature and is easily accessible, can be slightly readjusted as needed, for example by shifting or adding iron plates.

An embodiment of the magnet configuration in accordance with the invention is preferred with which a field forming device is partially disposed in a room temperature bore of a cryostat and partially within the cryostat, wherein the main field coil and the shielding coil are also disposed in the cryostat. In this manner, a portion of the ferromagnetic field forming device can be cooled, while another portion remains at room temperature where it is easily accessible for adjustment purposes.

In a favorable further developed variation of this embodiment, the field formation device is additionally designed to compensate field inhomogeneities caused by process tolerances of the main field coil and/or the shielding coil and/or the shielding body. To achieve this, the common field profile of the main field coil, the shielding coil and the ferromagnetic shielding body are measured after both coils have been manufactured and installed, and only then is the field formation device made and installed while taking the measuring results into account. This leads to an improved field homogeneity in the examination volume. Alternatively or in addition thereto, an electrical shim system (in particular, a normally conducting structure having a current circuit which is independent of that used for the main field coil) can be utilized, which serves to compensate for field inhomogeneities which are caused by production tolerances of the magnet configuration. The magnitude contribution from the electrical shim system at any location in the investigational volume is typically 200 ppm or less relative to $B_0$ at the center.

An embodiment is preferred with which the ferromagnetic shielding body is made from an outer wall of the cryostat in which at least the main field coil and the shielding coil are disposed. In this manner, the wall of the cryostat is used for a plurality of purposes.

The scope of the present invention also includes a magnetic resonance tomograph having a magnet configuration in accordance with the invention. An NMR tomograph in accordance with the invention has a particularly compact structure.

The scope of the present invention also includes a nuclear spin resonance spectrometer having a magnet configuration in accordance with the invention. An NMR spectrometer in accordance with the invention is also particularly compact.

Finally, the scope of the present invention also includes an ion cyclotron resonance mass spectrometer having a magnet configuration in accordance with the invention. The ICR spectrometer is also particularly compact.

Further advantages of the invention will become apparent from the description and the drawing. Also, according to the invention, the features mentioned above and the further explained features can be used individually or in any combination. The embodiments shown and described must not be understood as an exhaustive list, rather are examples which help explain the invention.

BRIEF DESCRIPTION OF THE DRAWING

The invention is represented in the drawing and is explained further on the basis of embodiments, wherein:

FIG. 6 shows stray field lines r(z) around the magnet configuration, wherein the stray field has defined values between 0.1 T and 0.0005 T;

FIG. 7 shows a schematic view of an embodiment of a magnet configuration in accordance with the basis invention having a plurality of nested, unstructured solenoid coils constituting the main field coil and with a two-part shielding coil having two unstructured, symmetrically disposed solenoid coils; and FIG. 8 shows a schematic representation of a magnet configuration in accordance with the invention having several nested unstructured solenoid coils as the main field coil and a two-part shielding coil having two unstructured, symmetrical solenoid coils as well as a ferromagnetic shielding body.

DESCRIPTION OF THE PREFERRED EMBODIMENT

FIGS. 1 through 7 illustrate the basis invention corresponding to German patent application 10 2008 020 107.3-54 which is further developed in accordance with the present invention. In accordance with the present invention, the magnet configuration has a further component comprising an outer ferromagnetic shielding body. Within the context of an instant invention, the field profile $B_{F+AK}$ (z) which is commonly generated by the ferromagnetic field forming device and the ferromagnetic shielding body replaces the field profile $B_F$ (z) generated by the ferromagnetic field forming device of the basis invention. Accordingly, the field forming device and the shielding body replace the field forming device of the basis invention.

Figure 1:
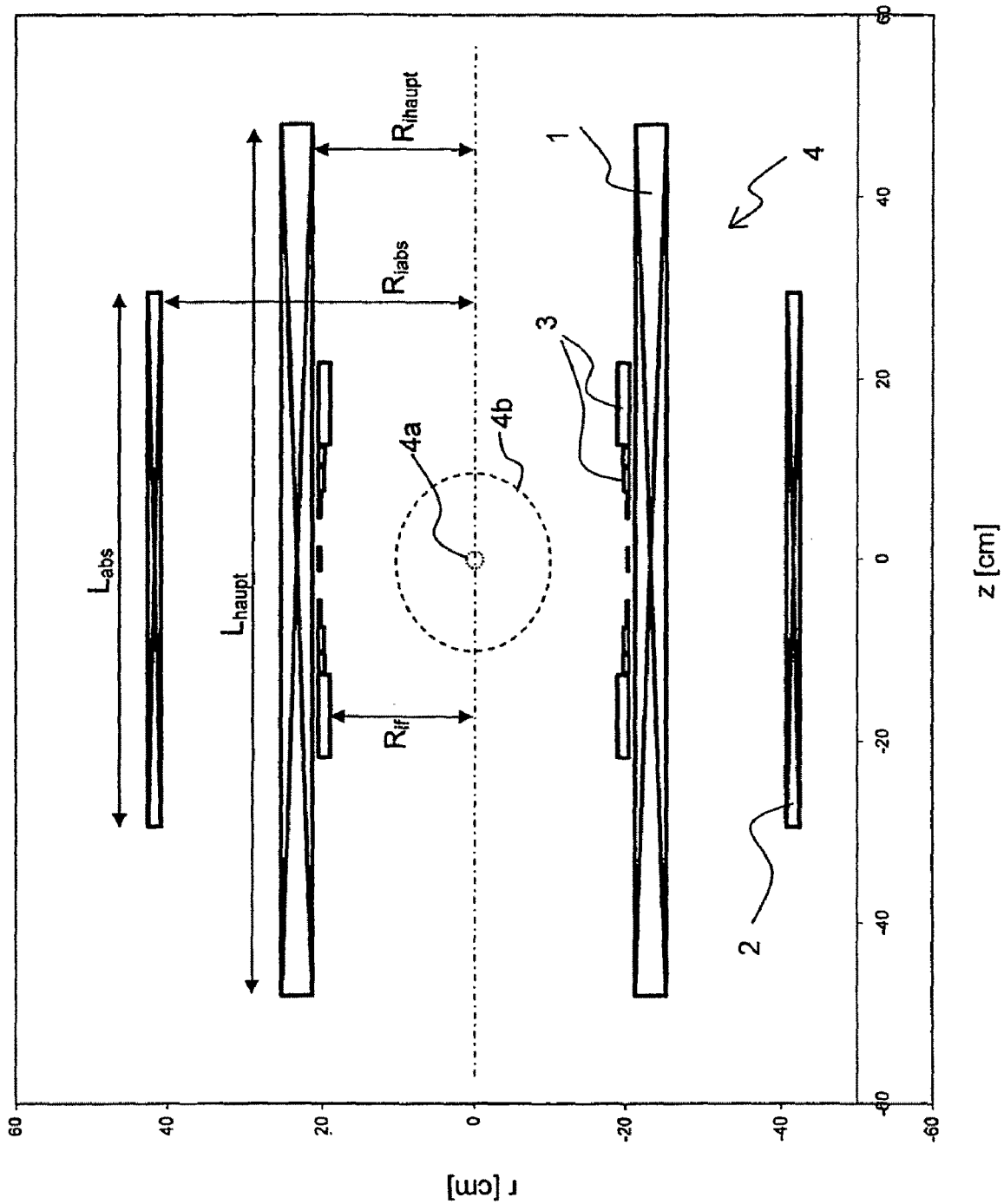
FIG. 1 shows a schematic, but true-to-scale cross section of an embodiment of the magnet configuration in accordance with the basis invention, having an unstructured solenoid coil as the main field coil and an unstructured solenoid coil as the shielding coil and with a ferromagnetic field formation device.

FIG. 1 illustrates a first embodiment of a magnet configuration in accordance with the basis invention, showing a trueto-scale, schematic, cross-sectional view. The magnet configuration 4 consists of a main field coil 1, a shielding coil 2, and a ferromagnetic field formation device 3. No further means for generating the magnetic field are used. The magnet configuration 4 is essentially rotational symmetric about the axis running in the z-direction (indicated by the dot-dashed line).

The magnet configuration 4 generates a homogeneous magnetic field B0 in an examination volume 4b around its center 4a (at z=0, r=0) which is aligned along the z-axis and has a strength of 7.055 T in the center 4a.

The main field coil 1 is an unstructured solenoid coil having an inner radius $R_{ihaupt}$ of 0.216 m, an exterior diameter of 0.253 m and a length $L_{haupt}$ of 0.96 m. The mean current density of this coil is 230.2 A/mm². The shielding coil 2 is also an unstructured solenoid coil with an inner diameter $R_{iabs}$ of 0.407 m, an outer diameter of 0.424 m, and a length $L_{abs}$ of 0.59 m. The mean current density is opposite to the current density in the main field coil 1 and is −274,0476 A/mm².

$L_{abs}$=0.614 $L_{haupt}$ applies to the length of the shielding coil, which is thus smaller than 0.65 $L_{haupt}$ and is thus a preferred embodiment. The main field coil 1 and the shielding coil 2 are electrically connected to each other in series, wherein the currents in those coils are oppositely directed so that the magnetic dipole moments of the two coils cancel in order to minimize the stray field.

Furthermore, the magnet configuration comprises the ferromagnetic field formation device 3, which is in this embodiment made up of nine rings made of iron or an iron alloy ("iron rings"). All iron rings in this embodiment have the same outer radius of 0.205 m. The inner radii differ and are selected so as to allow a large examination volume with high field homogeneity. The smallest inner radius $R_{if}$ of the field formation device 3 is 0.1894 m and corresponds to the inner radius of the entire magnet configuration 4. The field formation device 3 has thus a maximum thickness (wall thickness) of 0.0156 m in the radial direction. The iron rings are magnetized to their saturation magnetization in the axial direction by the strong magnetic field of about 7 T generated by the main field coil 1 and the shielding coil 2, wherein the saturation magnetization in this embodiment is 2.2 T.

Both the main field coil 1 and the shielding coil 2 in this embodiment are made of industrial superconductor wire on the basis of a niobium titanium alloy which is wound in the only winding chamber (not shown) of each of two carrying bodies. The field formation device 3 in this embodiment is attached to the radial interior of the carrying body of the main field coil 1 and has, just as the main field coil 1 and the shielding coil 2, a temperature of 4.2 K under operating conditions.

The magnet configuration 4, cooled down to an operating temperature of 4.2 K, is located inside a cryostat (not shown) which encloses the magnet configuration and has a total length of 1.3 m, an exterior diameter of about 1.2 m, and a bore with an interior diameter of 0.33 m, which surrounds the examination volume 4b in its center.

Figure 2:
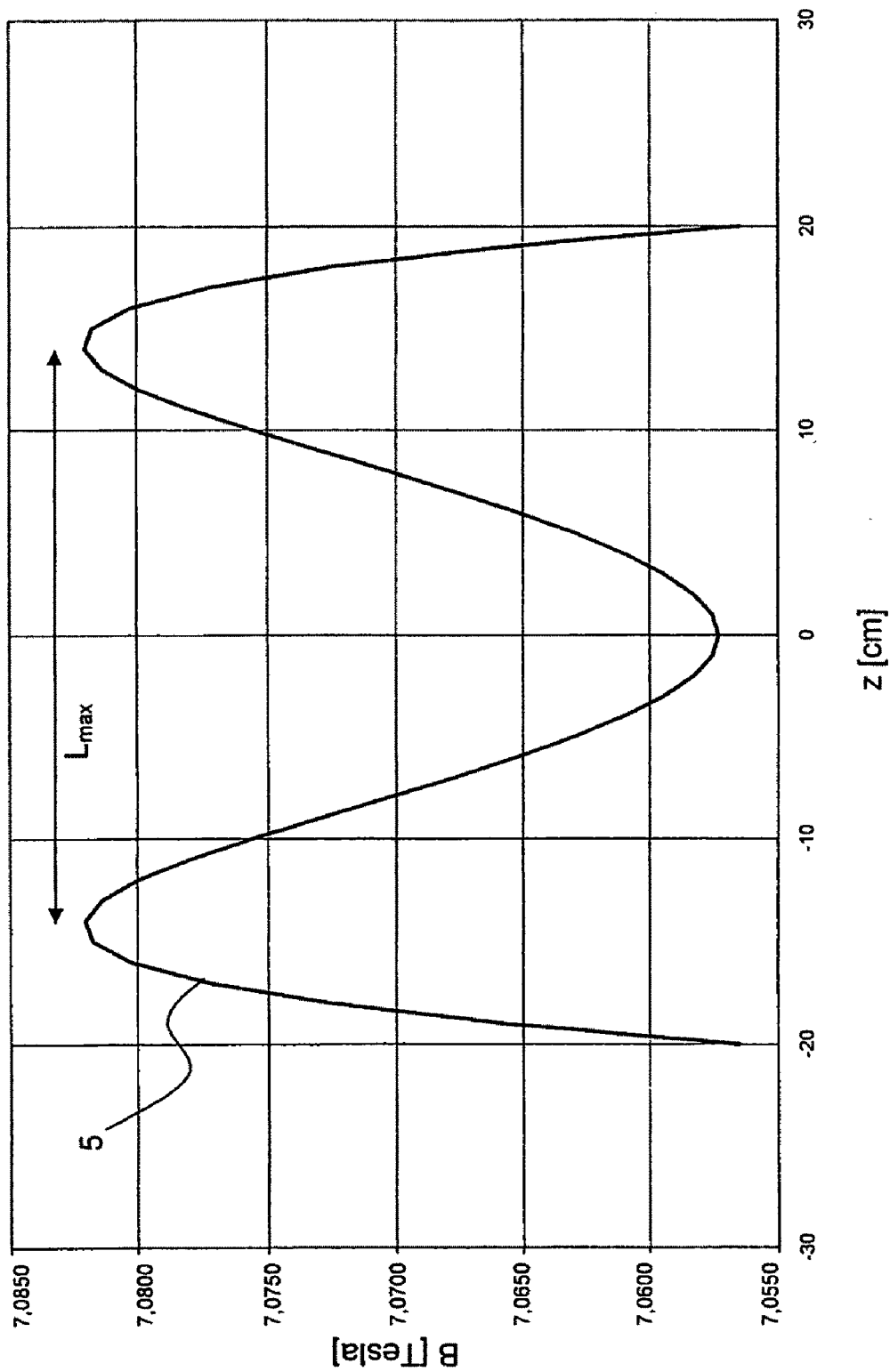
FIG. 2 shows the course of the axial magnetic field profile generated by the main field coil and the shielding coil of the magnet configuration as shown in FIG. 1.

The axial magnetic field profile 5 shown in FIG. 2, generated by the main field coil 1 and the shielding coil 2 is M-shaped and has a local minimum in its center (at z=0), surrounded by two local maxima, wherein the maxima are $L_{max}$=0.28 m apart. Therefore, $L_{max}$=1.478 $R_{if}$ and is greater than 0.5 $R_{if}$, which corresponds to a preferred embodiment. At $B_{max}$=7.082 T, the maxima of the axial magnetic field profile exceed the minimum of the magnetic field profile of $B_{min}$=7.0573 T by 0.0247 T, equivalent to 3488 ppm, which corresponds to a preferred embodiment as well. Both preferred embodiments cause the radial extent of the field formation device 3 of 0.0156 m in these embodiments to remain low while the entire magnet configuration 4 still generates a particularly large examination volume with high homogeneity.

Figure 3:
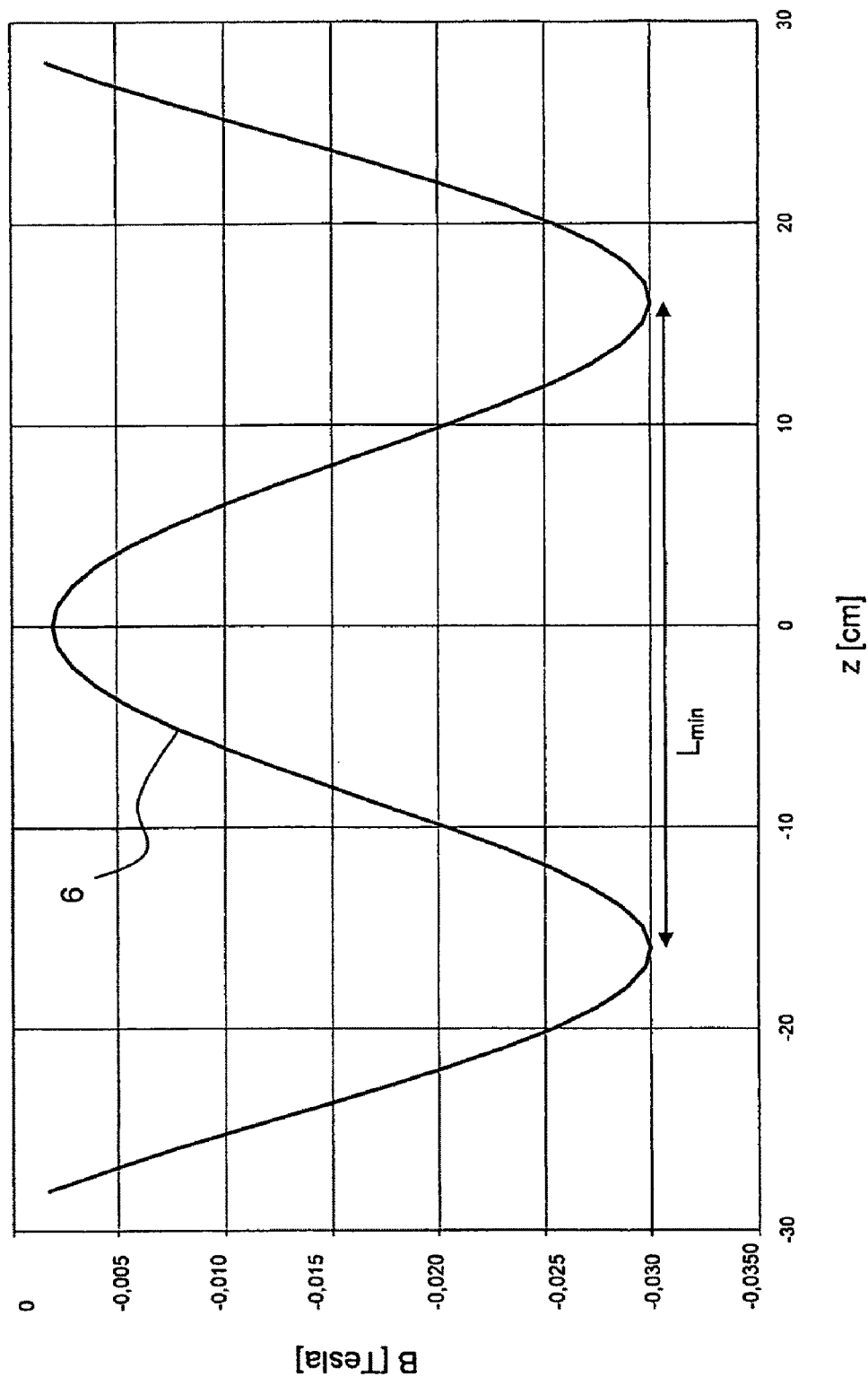
FIG. 3 shows the course of the axial magnetic field profile generated by the ferromagnetic field formation device of the magnet configuration as shown in FIG. 1.

FIG. 3 shows the corresponding W-shaped axial magnet field profile 6 of the field formation device 3. It has a local maximum of −0.002 T in the center, surrounded by two local minima of −0.03 T. The distance $L_{min}$ between the minima is 0.32 m in this embodiment.

It should be noted that, within the scope of the invention, $L_{min} \leq L_{abs}$ and $L_{max} \leq L_{abs}$ typically applies.

Figure 4:
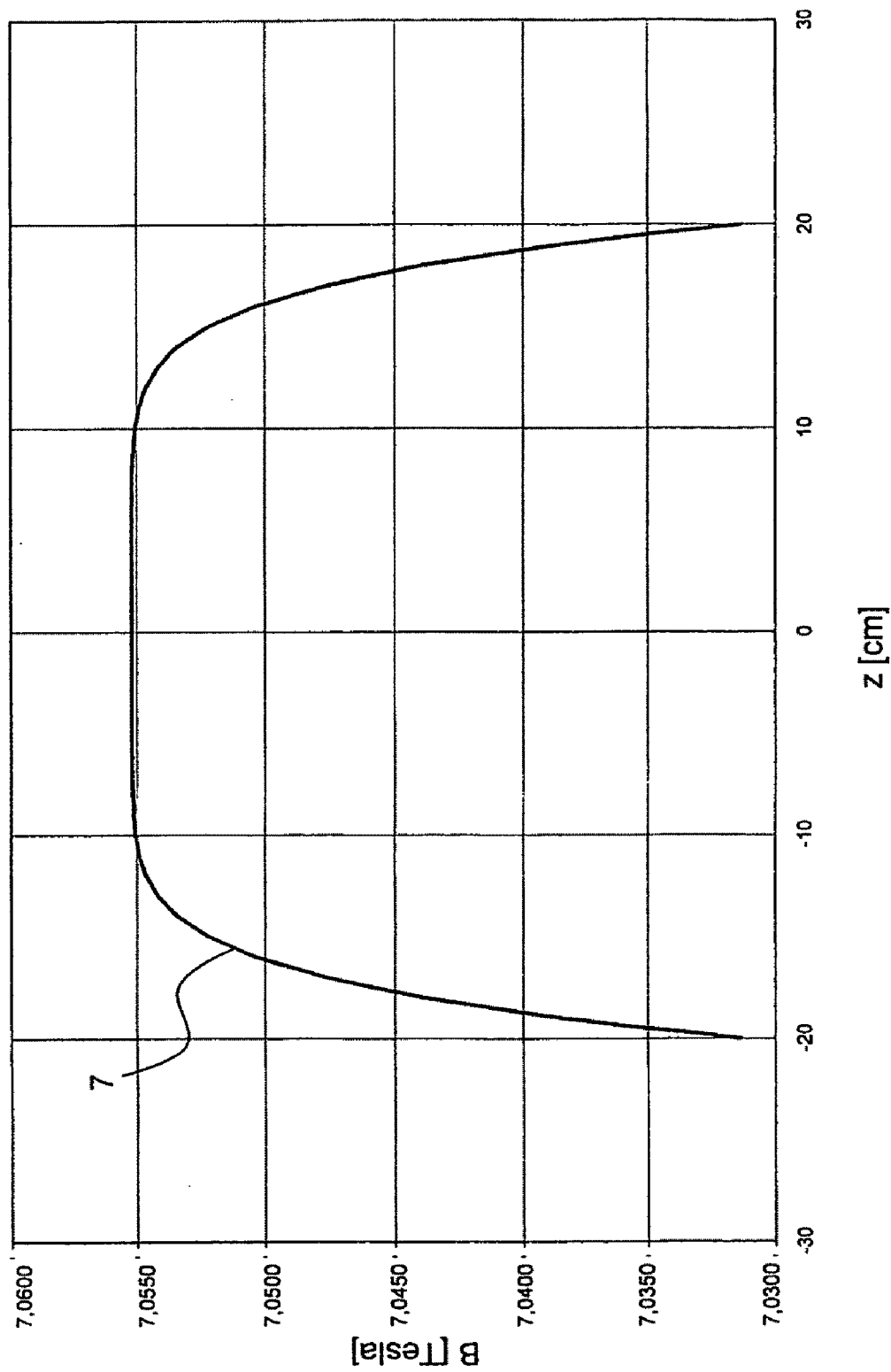
FIG. 4 shows the course of the axial magnetic field profile generated by the main field coil and the shielding coil and the ferromagnetic field formation device of the magnet configuration as shown in FIG. 1.

The two axial magnetic field profiles 5 and 6 overlap to form the axial magnetic field profile 7 of the overall magnet configuration 4 shown in FIG. 4, which is very highly constant in an area of about 0.2 m in length around the center z=0. The relative variation of the magnetic field strength in this area is smaller than 2.5 ppm in this embodiment.

Figure 5:
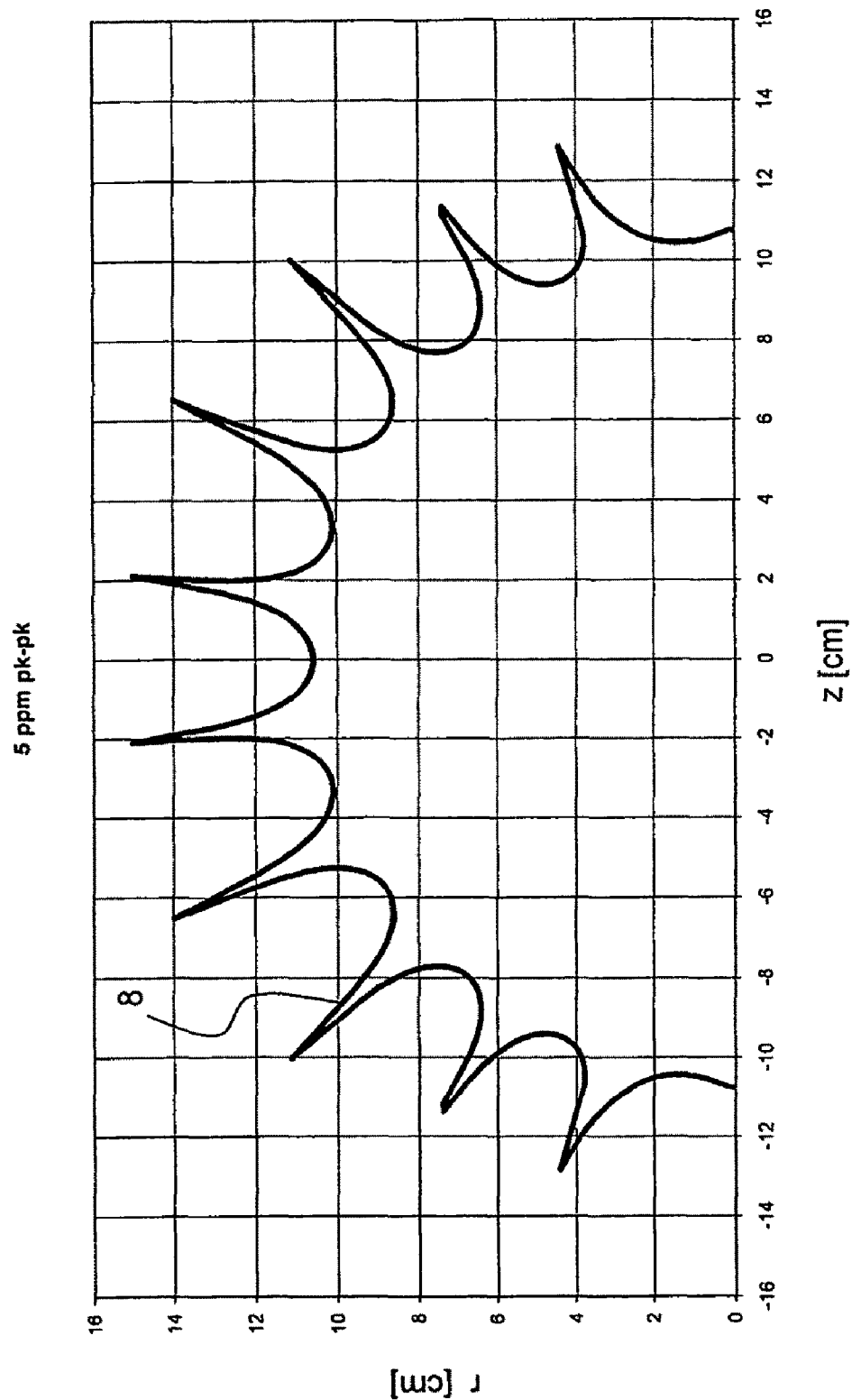
FIG. 5 shows the contour r(z) around the center of the examination volume in the geometrical center of the magnet configuration as shown in FIG. 1, within which the relative deviation of the magnetic field strength from the magnetic field strength in the center of the examination volume is less than +/−2.5 ppm (ppm: parts per million)

The spatial dimension of the area with high homogeneity in radial alignment is illustrated in FIG. 5. Line 8 indicates the radial position r for every axial position z whose relative deviation of the magnetic field strength B0 from the magnetic field strength in the center is smaller than +/−2.5 ppm. It is therefore apparent that the variation of the magnetic field strength within a spherical volume with a diameter of 20 cm is smaller than +/−2.5 ppm. A spherical volume with a radius of 10 cm around the center at z=0 can therefore be used as the examination volume.

FIG. 6 shows a quadrant of the magnet configuration 4 and the surrounding lines 9-13 of constant strength of the magnetic stray field of 0.0005 T (line 9), 0.001 T (line 10), 0.005 T (line 11), 0.01 T (line 12), and 0.1 T (line 13), whose small spatial extension is another advantage of the magnet configuration 4. The detailed course of these lines 9-13 can be influenced by slightly changing the radial and axial dimensions of the main field coil and the shielding coil. In magnet configuration 4, the extension of the 0.0005 T line is +/−3.5 m in the axial direction and +/−2.2 m laterally around the center of configuration 4.

FIG. 7 shows the schematic structure of another magnet configuration 14 in accordance with the basis invention having two radially nested unstructured solenoid coils 15 and 16 with current running through them in the same direction and forming the main field coil, as well as a structured solenoid shielding coil with current running through it in an opposite direction and having two adjacent windings 17a, 17b. The two windings 17a, 17b can also be understood as individual, symmetrically located (relative to a mirror plane located in the center perpendicularly to axial alignment) unstructured solenoid coils. In this case, as well, a ferromagnetic field formation device 18 is needed to generate an overall highly homogeneous magnetic field.

Embodiment with additional outer shielding body.

FIG. 8 shows the schematic construction of a magnet configuration 91 in accordance with the invention. Two radially nested, unstructured solenoid coils 15 and 16 have current flowing through them in the same direction and constitute the main field coil 1. A structured solenoid coil having two neighboring windings 17a, 17b constitutes a shielding coil 2 and is driven by current in the opposite direction. An additional shielding body AK (shown cross hatched) surrounds this configuration in an axial and radial direction and is made from soft magnetic material. The soft magnetic material can e.g. be magnetic steel. The shielding body AK includes a radially outer cylindrical component 92 as well as two side plates 93a and 93b (each having an opening for the room temperature bore 94). In this embodiment, the shielding body AK defines, together with the inner tube 95, the outer portion of a cryostat 96 (the so-called vacuum jacket). Further details of the cryostat 96 are not shown for purposes of simplicity.

The shielding body AK effects a further reduction in the extent of the magnetic stray field of the magnet configuration 91. The shielding body AK mainly also influences the magnetic field dependence in the investigational volume. This influence on the magnetic field dependence is, however, small due to the relatively large separation of all portions 92, 93a, 93b of the shielding body AK from the investigational volume. In this embodiment, a ferromagnetic field forming device 18 is also utilized which cooperates with the influence of the magnetic field dependence of the shielding body AK to produce an overall magnetic field of higher homogeneity. In this embodiment, the ferromagnetic field forming device 18 is surrounded by the shielding body AK.

We claim:

1. A superconducting magnet configuration with active shielding for generating a homogeneous magnetic field $B_o$ in an examination volume, the magnet configuration comprising:
    a radially inner superconducting main field coil which is disposed rotationally symmetrically about a z-axis and having an axial length $L_{haupt}$, said main field coil comprising an unstructured solenoid coil or several radially nested unstructured solenoid coils, which are driven in a same direction;
    a superconducting shielding coil disposed coaxially and radially exterior to said main field coil, said shielding coil generating a magnetic field in the examination volume which is directed substantially opposite to a magnetic field generated by said main field magnet in the examination volume, said shielding coil having an axial length $L_{abs}$ which is smaller than said axial length $L_{haupt}$ of said main field coil, wherein a combined axial magnetic field profile generated by said main field coil and said shielding coil has a field strength minimum along said z-axis in a center of the examination volume and a field strength maximum on each side of said center;
    a ferromagnetic field formation device disposed radially within said main field coil; and
    a ferromagnetic shielding body, said ferromagnetic shielding body surrounding said main field coil and said shielding coil in a radial and axial direction, wherein a combined axial magnetic field profile generated by said ferromagnetic field formation device and said ferromagnetic shielding body has a field strength maximum along said z-axis in said center of the examination volume and a field strength minimum on both sides of said center.

2. The magnet configuration of claim 1, wherein said shielding coil comprises an unstructured solenoid coil.

3. The magnet configuration of claim 1, wherein $L_{max} > 0.5 * R_{if}$ obtains for an axial distance $L_{max}$ between maxima of said field strength of said magnetic field profile generated by said main field coil and said shielding coil relative to an inner radius $R_{if}$ of said field formation device.

4. The magnet configuration of claim 1, wherein a field strength $B_{max}$ of maxima of said magnetic field profile generated by said main field coil and said shielding coil is between 10 ppm and 10,000 ppm or between 100 ppm and 5000 ppm, higher than a field strength $B_{min}$ of said central minimum of said magnetic field profile.

5. The magnet configuration of claim 1, wherein said main field coil and said shielding coil are connected in series.

6. The magnet configuration of claim 5, further comprising a superconducting switch for shortcircuiting a circuit formed by said main field coil and said shielding coil.

7. The magnet configuration of claim 1, wherein $L_{abs} \leq 0.85 L_{haupt}$ or $L_{abs} \leq 0.65 L_{haupt}$.

8. The magnet configuration of claim 1, wherein the magnet configuration is designed to generate a homogeneous magnetic field in the examination volume having a field strength of $B_{ges} \geq 6$ Tesla.

9. The magnet configuration of claim 1, wherein said field formation device has an inner radius $R_{if} \geq 80$ mm or $R_{if} \geq 300$ mm.

10. The magnet configuration of claim 1, wherein $R_{iabs} \leq 2.2 * R_{ihaupt}$ or $R_{iabs} 2.0 * R_{ihaupt}$, wherein $R_{ihaupt}$ is the inner radius of the main field coil and $R_{iabs}$ is the inner radius of the shielding coil.

11. The magnet configuration of claim 1, further comprising a cryostat within which said field formation device, said main field coil, and said shielding coil are disposed.

12. The magnet configuration of claim 1, further comprising a cryostat having a room temperature bore, wherein said field formation device is completely disposed inside said room temperature bore of said cryostat and said main field coil as well as said shielding coil are disposed within said cryostat.

13. The magnet configuration of claim 1, further comprising a cryostat having a room temperature bore, wherein said field forming device is partially disposed in said room temperature bore of said cryostat and partially within said cryostat, said main field coil and the shielding coil being disposed in said cryostat.

14. The magnet configuration of claim 12, wherein said field formation device is additionally structured and disposed to compensate for field inhomogeneities caused by process tolerances in said main field coil and/or in said shielding coil and/or said shielding body.

15. The magnet configuration of claim 13, wherein said field formation device is additionally structured and disposed to compensate for field inhomogeneities caused by process tolerances in said main field coil and/or in said shielding coil and/or said shielding body.

16. The magnet resonance configuration of claim 1, further comprising a cryostat, wherein said ferromagnetic shielding body is formed by an outer wall of said cryostat in which at least said main field coil and said shielding coil are disposed.

17. A magnetic resonance tomograph having the magnet configuration of claim 1.

18. A nuclear spin resonance spectrometer having the magnet configuration of claim 1.

19. An ion cyclotron resonance mass spectrometer having the magnet configuration of claim 1.

* * * * *